US011287563B2

(12) United States Patent
El-Ghoroury et al.

(10) Patent No.: US 11,287,563 B2
(45) Date of Patent: Mar. 29, 2022

(54) POLARIZED LIGHT EMISSION FROM MICRO-PIXEL DISPLAYS AND METHODS OF FABRICATION THEREOF

(71) Applicant: Ostendo Technologies, Inc., Carlsbad, CA (US)

(72) Inventors: Hussein S. El-Ghoroury, Carlsbad, CA (US); Natalie DeMille, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 15/672,060

(22) Filed: Aug. 8, 2017

(65) Prior Publication Data
US 2018/0156965 A1    Jun. 7, 2018

Related U.S. Application Data

(60) Provisional application No. 62/429,033, filed on Dec. 1, 2016.

(51) Int. Cl.
*F21V 8/00*    (2006.01)
*G09G 3/20*    (2006.01)
(Continued)

(52) U.S. Cl.
CPC ......... *G02B 6/0056* (2013.01); *G02B 6/0078* (2013.01); *G09G 3/2003* (2013.01); *G09G 3/32* (2013.01); *H01L 27/156* (2013.01); *H01L 33/06* (2013.01); *H01L 33/16* (2013.01); *H01L 33/32* (2013.01); *H01L 33/387* (2013.01);
(Continued)

(58) Field of Classification Search
CPC ... G02B 6/0056; G02B 6/0078; H01L 33/387; H01L 27/156; H01L 33/16; H01L 33/58; H01L 33/06; H01L 33/32; H01L 33/382; H01L 25/0756; H01L 33/08;
(Continued)

(56) References Cited

U.S. PATENT DOCUMENTS

| 5,083,857 A | 1/1992 | Hornbeck |
| 5,952,789 A | 9/1999 | Stewart et al. |

(Continued)

FOREIGN PATENT DOCUMENTS

| CN | 101847578 | 9/2010 |
| CN | 109997240 A | 7/2019 |

(Continued)

OTHER PUBLICATIONS

Kundys et al. ("A study of the optical and polarisation properties of InGaN/GaN multiple quantum wells grown on a-plane and m-plane GaN substrates," Science and Technology of Advanced Materials, vol. 17 No. 1 736-743, 2016) (Year: 2016).*

(Continued)

*Primary Examiner* — Yasser A Abdelaziez
(74) *Attorney, Agent, or Firm* — Greg Caldwell, Esq.; W. Eric Boyd, Esq.

(57) ABSTRACT

A method and apparatus for achieving selective polarization states of emitted visible or other light in a stacked multicolor emissive display device by utilizing nonpolar, semipolar or strained c-plane crystallographic planes of semiconductor materials for light emitting structures within an electronic emissive display device.

3 Claims, 4 Drawing Sheets c-plane

Polar a-plane     m-plane

Non-Polar

Semi-Polar (51) Int. Cl.
  *G09G 3/32* (2016.01)
  *H01L 27/15* (2006.01)
  *H01L 33/06* (2010.01)
  *H01L 33/16* (2010.01)
  *H01L 33/32* (2010.01)
  *H01L 33/38* (2010.01)
  *H01L 33/58* (2010.01)
  *H01L 25/075* (2006.01)
  *G09G 3/36* (2006.01)
  *H01L 33/08* (2010.01)

(52) U.S. Cl.
  CPC ............... *H01L 33/58* (2013.01); *G09G 3/36* (2013.01); *G09G 2300/046* (2013.01); *G09G 2310/0264* (2013.01); *G09G 2320/064* (2013.01); *H01L 25/0756* (2013.01); *H01L 33/08* (2013.01); *H01L 33/382* (2013.01)

(58) Field of Classification Search
  CPC ............ G09G 3/2003; G09G 3/32; G09G 2310/0264; G09G 2320/064; G09G 3/36; G09G 2300/046
  See application file for complete search history.

(56) References Cited

U.S. PATENT DOCUMENTS

| | | |
|---|---|---|
| 6,245,590 B1 | 6/2001 | Wine et al. |
| 6,960,010 B2 | 11/2005 | Matsumoto et al. |
| 7,325,957 B2 | 2/2008 | Morejon et al. |
| 7,396,130 B2 | 7/2008 | Chen et al. |
| 7,623,560 B2 | 11/2009 | El-Ghoroury et al. |
| 7,767,479 B2 | 8/2010 | El-Ghoroury et al. |
| 7,781,962 B2 | 8/2010 | Adachi et al. |
| 7,829,902 B2 | 11/2010 | El-Ghoroury et al. |
| 7,846,757 B2 | 12/2010 | Farrell, Jr. et al. |
| 7,854,514 B2 | 12/2010 | Conner et al. |
| 8,049,231 B2 | 11/2011 | El-Ghoroury et al. |
| 8,098,265 B2 | 1/2012 | El-Ghoroury et al. |
| 8,125,579 B2 | 2/2012 | Khan et al. |
| 8,243,770 B2 | 8/2012 | El-Ghoroury et al. |
| 8,567,960 B2 | 10/2013 | El-Ghoroury et al. |
| 8,629,065 B2 | 1/2014 | Spiberg et al. |
| 8,647,435 B1 | 2/2014 | Dmitriev et al. |
| 8,673,074 B2 | 3/2014 | Usikov et al. |
| 8,728,938 B2 | 5/2014 | Ivantsov et al. |
| 8,767,145 B1 | 7/2014 | Zhang |
| 8,912,017 B2 | 12/2014 | El-Ghoroury et al. |
| 8,992,684 B1 | 3/2015 | Kovalenkov et al. |
| 9,023,673 B1 | 5/2015 | Shapovalov et al. |
| 9,159,700 B2 | 10/2015 | Sakariya et al. |
| 9,306,116 B2 | 4/2016 | El-Ghoroury et al. |
| 9,416,464 B1 | 8/2016 | Dmitriev et al. |
| 9,443,727 B2 | 9/2016 | Soukhoveev et al. |
| 2003/0232457 A1 | 12/2003 | Kawaguchi et al. |
| 2004/0125283 A1 | 7/2004 | Huang et al. |
| 2005/0088084 A1 | 4/2005 | Cok |
| 2006/0205199 A1 | 9/2006 | Baker et al. |
| 2008/0054283 A1 | 3/2008 | Min et al. |
| 2009/0086170 A1 | 4/2009 | El-Ghoroury et al. |
| 2009/0243043 A1 | 10/2009 | Wang |
| 2009/0278998 A1* | 11/2009 | El-Ghoroury .......... B82Y 20/00 348/744 |
| 2010/0003777 A1 | 1/2010 | El-Ghoroury et al. |
| 2010/0012948 A1 | 1/2010 | Usikov et al. |
| 2010/0032695 A1 | 2/2010 | Fellows-DeMille et al. |
| 2010/0066921 A1 | 3/2010 | El-Ghoroury et al. |
| 2010/0220042 A1 | 9/2010 | El-Ghoroury et al. |
| 2010/0220262 A1* | 9/2010 | DeMille ............ G02F 1/133617 349/64 |
| 2010/0317132 A1 | 12/2010 | Rogers et al. |
| 2011/0108954 A1 | 5/2011 | Spiberg et al. |
| 2011/0188528 A1 | 8/2011 | Kisin et al. |
| 2012/0033113 A1 | 2/2012 | El-Ghoroury et al. |
| 2012/0068192 A1 | 3/2012 | Kim et al. |
| 2012/0224148 A1 | 9/2012 | Natsumeda et al. |
| 2014/0349427 A1* | 11/2014 | El-Ghoroury ....... H01L 21/0242 438/31 |
| 2015/0155439 A1 | 6/2015 | Cich et al. |
| 2015/0206796 A1 | 7/2015 | Dasgupta et al. |
| 2016/0149075 A1 | 5/2016 | Atanackovic |
| 2019/0257999 A1 | 8/2019 | El-Ghoroury et al. |
| 2019/0258000 A1 | 8/2019 | El-Ghoroury et al. |

FOREIGN PATENT DOCUMENTS

| | | |
|---|---|---|
| EP | 3549185 A1 | 10/2019 |
| JP | 2020501360 A | 1/2020 |
| KR | 20190086696 A | 7/2019 |
| TW | 201833889 A | 9/2018 |
| WO | WO-2012/140257 | 10/2012 |
| WO | WO-2016/043748 | 3/2016 |
| WO | 2018102311 A1 | 6/2018 |

OTHER PUBLICATIONS

Zhuang et al. ("Optical polarization charateristics of c-pale InGaN/GaN asymmetric nanostructures," J. Appl. Physics, 118, 233111, 2015) (Year: 2015).*

Brinkley et al. ("Polarized Spontaneous Emission from Blue-Green m-Plane GaN-Based Light Emitting Diodes," Appl. Phys. Lett., 98, 011110, 2011) (Year: 2011).*

Gardner et al. ("Polarization Anisotropy in the Electroluminescence of m-Plane InGan-GaN Multiple-Quantum-Well Light-Emitting Diodes," Appl. Phys. Lett. 2005, 86, 111101, 2005) (Year: 2005).*

Paskov et al. "Anisotropy of the Free Exciton Emission in GaN Grown on a-Plane Sapphire," Physica Status Solidi a-Applied Research, 190, 75-79, 2002) (Year: 2002).*

Zhuang et al. ("Optical polarization characteristics of c-plane InGaN/GaN asymmetric nanostructures," Journal of Applied Physics, 118, 233111, 2015) (Year: 2015).*

Martinez et al. ("Ultrafast All-Optical Switching in a Silicon-Nanocrystal-Based Silicon Slot Waveguide at Telecom Wavelengths," Nano Letter, 10, 1506-1511, 2010) (Year: 2010).*

Fan et al. ("Strain effect on the optical polarization properties of c-plane Al0.26Ga0.74N/GaN superlattices," Optics Express, vol. 22, No. 6, pp. 6322-6328, Mar. 24, 2014) (Year: 2014).*

"International Search Report and Written Opinion of the International Searching Authority dated Feb. 12, 2018; International Application No. PCT/US2017/063508", dated Feb. 12, 2018.

Ajia, Idris A. et al., "Excitonic localization in AlN-rich AlxGa1-xN/AlyGa1-yN multi-quantum-well grain boundaries", Applied Physics Letters, vol. 105, 2014, pp. 122111-1 to 122111-5.

Chuang, S. L. et al., "k •p method for strained wurtzite semiconductors", Physical Review B, vol. 54, No. 4, Jul. 15, 1996, pp. 2491-2504.

Craven, M. D. et al., "Structural and electrical characterization of a-plane GaN grown on a-plane SiC", Physica Status Solidi (c), vol. 0, No. 7, 2003, pp. 2132-2135.

Craven, M. D. et al., "Structural characterization of nonpolar (1120) a-plane GaN thin films grown on (1102) r-plane sapphire", Applied Physics Letters, vol. 81, No. 3, Jul. 15, 2002, pp. 469-471.

Domen, K. et al., "Analysis of polarization anisotropy along the c axis in the photoluminescence of wurtzite GaN", Applied Physics Letters, vol. 71, No. 14, Oct. 6, 1997, pp. 1996-1998.

Ehrentraut, Dirk et al., "High Quality, Low Cost Ammonothermal Bulk GaN Substrates", Japanese Journal of Applied Physics, vol. 52, 2013, pp. 08JA01-1 to 08JA01-4.

Ghosh, Sandip et al., "Electronic band structure of wurtzite GaN under biaxial strain in the M plane investigated with photoreflectance spectroscopy", Physical Review B, vol. 65, 2002, pp. 075202-1 to 075202-7.

Jeon, J. B. et al., "Strain effects on optical gain in wurtzite GaN", Journal of Applied Physics, vol. 82, No. 1, Jul. 1, 1997, pp. 386-391.

Jie-Jun, Wu et al., "GaN substrate and GaN homo-epitaxy for LEDs: Progress and challenges", Chinese Physics B, vol. 24, No. 6, 2015, pp. 068106-1 to 068106-10.

(56) References Cited

OTHER PUBLICATIONS

Larssen, P. A., "Crystallographic Match in Epitaxy between Silicon and Sapphire", Acta Crystallographica, vol. 20, 1966, pp. 599-602.

Manasevit, H. M. et al., "The Use of Metalorganics in the Preparation of Semiconductor Materials, IV. The Nitrides of Aluminum and Gallium", J. Electrochem. Soc., vol. 118, No. 11, 1971, pp. 1864-1868.

Rau, B. et al., "In-plane polarization anisotropy of the spontaneous emission of M-plane GaN/(Al,Ga)N quantum wells", Applied Physics Letters, vol. 77, No. 21, Nov. 20, 2000, pp. 3343-3345.

Schmidt, Mathew C. et al., "High Power and High External Efficiency m-Plane InGaN Light Emitting Diodes", Japanese Journal of Applied Physics, vol. 46, No. 7, 2007, pp. L126-L128.

Shen, Y. C. et al., "Auger recombination in InGaN measured by photoluminescence", Applied Physics Letters, vol. 91, 2007, pp. 141101-1 to 141101-3.

Takeuchi, Tetsuya et al., "Quantum-Confined Start Effect due to Piezoelectric Fields in GaInN Strained Quantum Wells", Japanese Journal of Applied Physics, vol. 36, Part 2, No. 4A, Apr. 1, 1997, pp. L382-L385.

Waltereit, P. et al., "Nitride semiconductors free of electrostatic fields for efficient white light-emitting diodes", Nature, vol. 406, Aug. 24, 2000, pp. 865-868.

Zhao, Yuji et al., "Valence band states and polarized optical emission from nonpolar and semipolar III-nitride quantum well optoelectronic devices", Japanese Journal of Applied Physics, vol. 53, 2014, pp. 100206-1 to 100206-17.

"Office Action dated Oct. 9, 2019; U.S. Appl. No. 16/401,961", dated Oct. 9, 2019.

"Office Action dated Oct. 9, 2019; U.S. Appl. No. 16/401,976", dated Oct. 9, 2019.

Zhuang, Zhe et al., "Optical polarization characteristics of c-plane InGaN/GaN asymmetric nanostructures", Journal of Applied Physics, vol. 118, 2015, pp. 233111-1 to 233111-7.

First Office Action for Chinese Patent Application No. 201780074598. 0, dated Apr. 2, 2021, 10 pages.

Office Action for Taiwan Patent Application No. 106142130, dated Sep. 1, 2021, 5 pages.

* cited by examiner

POLARIZED LIGHT EMISSION FROM MICRO-PIXEL DISPLAYS AND METHODS OF FABRICATION THEREOF

CROSS-REFERENCE TO RELATED APPLICATIONS

This application claims the benefit of U.S. Provisional Patent Application No. 62/429,033 filed Dec. 1, 2016.

BACKGROUND OF THE INVENTION

1. Field of the Invention

The invention relates to solid state light emitters such as LEDs and laser diode structures. More specifically, the invention relates to solid state light emitting structures fabricated from III-nitride materials that take advantage of III-nitride material's unique crystallographic properties whereby polarized light is emitted from the light emitting structures.

2. Prior Art

Solid state light emitters are at the forefront of today's commercially-available electronic display systems. Many display systems utilize the properties of light polarization in order to obtain increased contrast ratios between "on" and "off" pixels on the display element. The use of unpolarized light requires that such display systems incorporate multiple polarizers and polarizing optics, making them larger, more complex, less energy efficient, and costly. The material system of III-nitrides affords a way to crystallographically tailor the polarization state of the emitted light from the III-nitride material by selecting crystallographic planes in the material that favor certain polarization states. This, in turn, allows for a solid state light emitting system to be fabricated with a minimum amount of light emission engineering, inherently making the system more efficient in terms of power consumption and design.

Certain commercially available LEDs utilize a III-nitride material system. The AlGaInN material system, with its large bandgap ranging from the deep UV to near-infrared emission wavelengths is an attractive system for electronic displays since its output covers the entire visible electromagnetic spectrum. The majority of GaN LEDs used with existing display technologies are grown on the polar (0001) c-plane of wurtzite GaN. Non-basal planes of GaN however, afford distinct advantages and different optical properties to the traditional c-plane GaN. Undesirably, due to the polarization-related electric fields inside the multi-quantum wells for c-plane GaN, the quantum confined Stark effect (QCSE) causes a lower energy recombination transition and a characteristic blue shift in the peak emission wavelength is observed as current density is increased (T. Takeuchi, S. Sota, M. Katsuragawa, M. Komori, H. Takeuchi, H. Amano, and I. Akasaki, "Quantum-confined Stark effect due to piezoelectric fields in GaInN strained quantum wells," Japanese Journal of Applied Physics 36, L382-L385 (1997)). Another undesirable consequence of c-plane growth is the efficiency droop that occurs at higher current densities (Y. C. Shen, G. O. Mueller, S. Watanabe, N. F. Gardner, A. Munkholm, and M. R. Krames, "Auger recombination in InGaN measured by photoluminescence," Applied Physics Letters, 91, 141101 (2007)).

Figure 1:
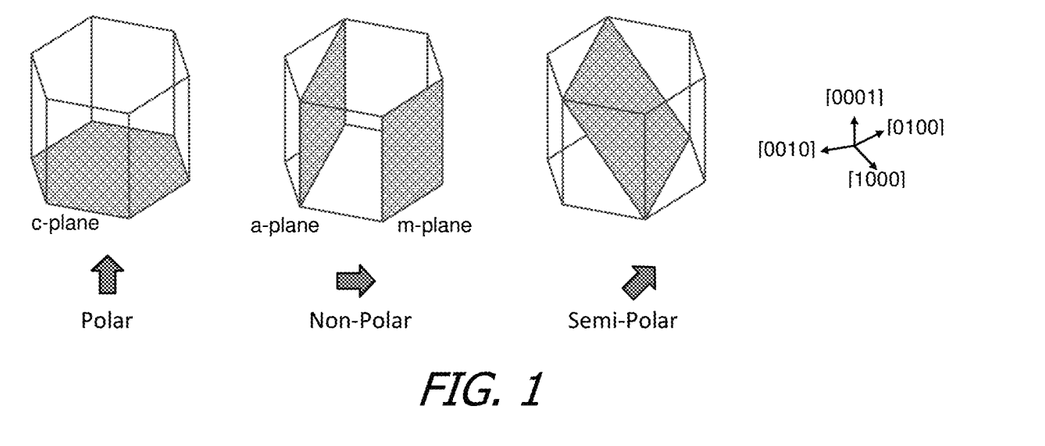
FIG. 1 depicts various crystallographic planes in a GaN crystal structure.

One of the first high quality, nonpolar growth materials was reported on the m-plane of GaN in 2000 by P. Waltereit, O. Brandt, A. Trampert, H. T. Grahn, J. Menniger, M. Ramsteiner, M. Reiche, and K. H. Ploog, "Nitride semiconductors free of electrostatic fields for efficient white light-emitting diodes," Nature 406, 865 (2000). The nonpolar planes of GaN form a 90° angle with the c-plane and the semipolar planes form an intermediate angle between 0° and 90°. The semipolar planes also are those planes with a nonzero h, k, or i index as well as a nonzero/index in the Miller-Bravis indexing convention. Various crystallographic planes of hexagonal GaN crystal material, including polar, nonpolar, and semipolar planes, are shown in FIG. 1.

Unlike the basal c-plane in GaN, the nonpolar planes and semipolar planes show an unequal photon emission that is dependent on the direction of the electric vector, i.e.; the intensity of the light perpendicular (E⊥c) and parallel (E∥c) to the c-axis is unequal. Using S. L Chuang and C. S. Chang, "k-p method for strained wurtzite semiconductors," *Physical Review B*, 54, 2491-2504 (1996), who derived the effective-mass Hamiltonian for wurtzite semiconductors including strain, J. B. Jeon, B. C. Lee, Yu. M. Sirencko, K. W. Kim, and M. A. Littlejohn, "Strain effects on optical gain in wurtzite GaN," *Journal of Applied Physics*, 82, 386-391 (1997) was able to lay theoretical work on the anisotropy in the optical gain of wurtzite GaN and showed that this anisotropy is caused by the anisotropic valence bands. Mathematically, they showed that using the averaged momentum matrix element which was taken from the full 6×6 Hamiltonian for the valence bands, the valence band factors must contribute to the anisotropy since they are unequal. The valence bands for GaN are mainly composed of N 2p states and, at the Brillouin-zone center where the wave vector k=0 (Γ point), the valence bands with atomic $p_x$ and $p_y$ character are degenerate and $p_z$ lies at a lower energy, thus splitting the valence band into two (known as the crystal field splitting, $\Delta_{cr}$) without considering the spin-orbital interaction. The spin-orbital interaction causes the states with $p_x$ and $p_y$ character to no longer be degenerate and forms the heavy hole (HH) and light hole (LH) bands for c-plane orientation. The energy band characteristics near the conduction band minimum don't suffer from this type of splitting since the states there are mainly composed of N and Ga s orbital character which are symmetrical in all directions.

The wave functions (basis states) for the valence bands in the c-plane (taken in the x-y plane) are defined by S. L Chuang and C. S. Chang, "k-p method for strained wurtzite semiconductors," *Physical Review B*, 54, 2491-2504 (1996) as:

$$|U_1\rangle = -\frac{1}{\sqrt{2}}|(X+iY)\uparrow\rangle,$$

$$|U_2\rangle = \frac{1}{\sqrt{2}}|(X-iY)\uparrow\rangle,$$

$$|U_3\rangle = |Z\uparrow\rangle,$$

$$|U_4\rangle = \frac{1}{\sqrt{2}}|(X-iY)\downarrow\rangle,$$

$$|U_5\rangle = -\frac{1}{\sqrt{2}}|(X+iY)\downarrow\rangle,$$

$$|U_6\rangle = |Z\downarrow\rangle$$

Figure 2:
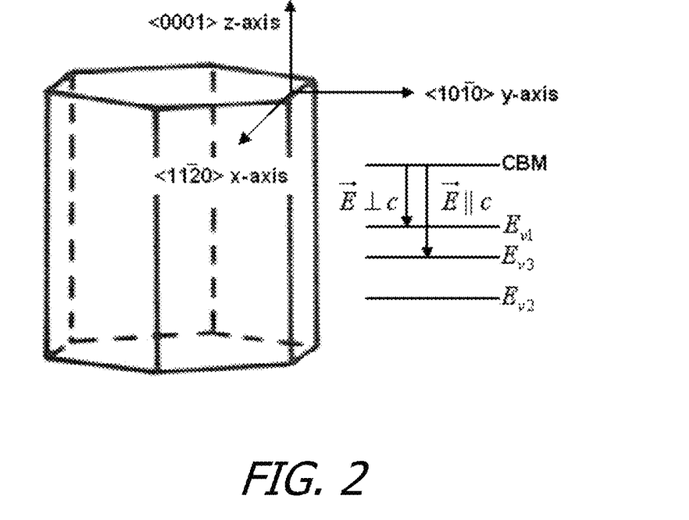
FIG. 2 illustrates a coordinate system for a hexagonal crystal of GaN in which the z-axis is taken perpendicular to the c-plane, the y-axis is taken perpendicular to the m-plane, and the x-axis is taken perpendicular to the a-plane and the relative placement of the three valence bands at the r point for the m-plane wherein $E_{v2}$ has the lowest energy (not $E_{v3}$).

It is clear from the above equation that the HH and LH bands are a mixture of ($|X\pm iY\rangle$) and in the c-plane orientation with isotropic biaxial strain (where the strain components $\varepsilon_{xx}=\varepsilon_{yy}$), there is no optical polarization anisotropy. However, for the nonpolar and semipolar crystal orientations, the strain is no longer isotropic. Using the m-plane as an example, it has been shown by K. Domen, K. Horino, A. Kuramata, and T. Tanahashi, "Analysis of polarization anisotropy along the c axis in the photoluminescence of wurtzite GaN," *Applied Physics Letters*, 71, 1996-1998 (1997) that the crystal field in GaN is strong enough to fix the axis of the p functions along the c axis. The original mixed states in the c-plane orientation are no longer maintained and the states now become |X⟩-like and |Y⟩-like S. L Chuang and C. S. Chang, "k-p method for strained wurtzite semiconductors," *Physical Review B*, 54, 2491-2504 (1996). The growth of InGaN/GaN wells, for example on m-plane with compressive, biaxial, anisotropic, strain the energy in the z-direction (c axis, |Z⟩ state which will be referred to as $E_{v3}$) which is now raised higher than the |Y⟩ state, $E_{v2}$. The |X⟩ state, $E_{v1}$, is also raised from the increased strain but it was already higher than the other two states so it maintains its relative position as the top-most energy valence band and the |Y⟩ state is lowered due to tensile strain along the m axis. A schematic of this argument is illustrated in FIG. 2.

When growth of GaN is directed along the c axis (z-direction), the electric field components ($E_x$ and $E_y$) will always be perpendicular to the c axis and, as the electrons transition to the valence bands radiatively, there is no difference in their state of polarization and thus the emitted light is uniformly unpolarized. However, when growth of GaN is directed along a nonpolar plane or semipolar plane (take the m-plane as an example again), the electric field component $E_z$ is now parallel to the c axis whereas $E_y$ is perpendicular to the c axis and the radiative transition probability for E⊥c is higher and prefers the $E_{v1}$(|X⟩ state) as compared to E∥c which is lower and prefers the $E_{v3}$(|Z⟩ state). Hence, two different states of polarization are now available in the light emission. To physically quantify the amount of polarization in a sample, its polarization ratio, ρ, defined as, $$\rho = \frac{(I_\perp - I_\parallel)}{(I_\perp + I_\parallel)}$$

where $I_\perp(I_\parallel)$ is the intensity of the light with polarization perpendicular (parallel) to the c axis and determines the limit of the maximum value for contrast ratios in display technologies. The degree of polarization will always deviate from unity due to the mixing of $p_z$ valence band states due to quantum confinement (B. Rau, P. Waltereit, O. Brandt, M. Ramsteiner, K. H. Ploog, J. Puls, and F. Henneberger, "In-plane polarization anisotropy of the spontaneous emission of M-plane GaN/(Al,Ga)N quantum wells," *Applied Physics Letters*, 77, 3343-3345 (2000)). A more thorough discourse on this effect is found in Y. Zhao, R. M. Farrell, Y.-R. Wu, and J. Speck, "Valence band states and polarized optical emission from nonpolar and semipolar III-nitride quantum well optoelectronic devices," *Japanese Journal of Applied Physics*, 53, 100206 (2014).

The proliferation of display technologies in the early 21$^{st}$ century has led to wide commercialization of varying display products. One of the most prevalent display systems is the liquid crystal display ("LCD"). A common type of LCD is the twisted nematic liquid-crystal display. It functions by having two electrode surfaces that provide homogeneous boundary conditions but with the two preferred orientation directions being rotated by 90° with respect to each other. In the absence of an electric field, a uniformly twisted region of nematic phase across the thickness of the device is achieved. When an electric field is provided that is perpendicular to the thin liquid film, the dielectric anisotropy of the liquid-crystal molecules causes them to turn and to align with the field direction. When the field is turned off, the molecules revert back to their original state.

The image contrast in an LCD device is achieved by reflective light utilizing an optical polarizer near the surface of both electrodes. The bottom LCD substrate is mirrored on the underside for high reflectivity. Light that is unpolarized enters through the top of the device and is polarized parallel to the upper orientation direction. If the electrode is in the "off" state, then the light proceeds through the device and the polarization follows the orientation of the liquid-crystal molecules as they twist through 90°. Next, the light passes through the bottom polarizer to the reflecting surface, bounces back through the bottom polarizer, reverses orientation again through the liquid-crystal molecules and passes through unhindered by the top polarizer. This "off" state therefore appears bright to the viewer since they are seeing the ambient light that first entered the device. For the "on" state, the light again enters the top polarizer but now the electrodes are activated and the liquid-crystal molecules are aligned normal to the substrate. Therefore, no rotation of the polarization direction occurs so no light passes through to the bottom polarizer to be reflected back to the viewer. In this case, the "on" state appears dark to the observer. This "off" and "on" state produces acceptable image contrast for the display.

Three of the leading small form factor electronic display structures utilize reflective technology in one form or another; switchable mirrors that move into an on/off position (U.S. Pat. No. 5,083,857) and laser beam steering with a scanning mirror (U.S. Pat. No. 6,245,590) each require some type of a light source to be integrated into their MEMS device; liquid crystal on silicon ("LCoS") incorporates a CMOS reflective layer (U.S. Pat. No. 7,396,130 and US Pub. No. 2004/0125283) each require a polarized light source for a complete system; and active matrix OLEDs and LEDs; while boasting less complexity, still benefit from an additional polarizer element to eliminate ghost images caused by reflections (U.S. Pat. Nos. 5,952,789 and 9,159,700).

Numerous prior art display devices utilize additional polarizing elements in order to create polarized light for use in displays. Superfluous objects that transform the electric field of the light after it has been emitted from the active area of the device are a common solution. Examples of applications pertinent to the present invention include, but are not limited to, external polarization layers, stand-alone polarization separation films with or without the use of phase plates, periodic grating structures, and polarizing beam splitters, etc. (U.S. Pat. Nos. 8,125,579, 6,960,010, 8,767, 145, 7,781,962, 7,325,957, 7,854,514 and US Pub. No. 2005/0088084).

Specifically, US Pub. No 2008/0054283 uses a plurality of metal nanowires as a polarization control layer that is grown as an additional semiconductor layer on the structure. One prior art example, WO 2012140257, utilizes a semiconductor chip that emits polarized light by incorporating a lattice structure to selectively enhance the desired radiation component, thus selecting which polarization state to emit. Nonetheless, this remains an additional element to be placed onto the semiconductor chip in order for polarized light emission to occur and the above prior art mentions nothing about how to actually incorporate the polarization technology into a display product.

No prior art has been identified that describes a systematic method for achieving selective polarization states by utilizing various crystallographic planes of semiconductor materials for micro-LED display purposes.

A novel emissive imager is disclosed in U.S. Pat. Nos. 7,623,560, 7,767,479, 7,829,902, 8,049,231, 8,243,770, 8,098,265, 8,567,960 each patent of which is fully incorporated by reference herein, and is a micro-semiconductor emissive display device capable of efficiently generating the visible spectrum of electromagnetic radiation. Although the usage of the disclosed emissive imager can be readily applied to general solid state lighting, the display applications of such a device have already been achieved. This emissive "Quantum Photonic Imager" (QPI) emissive display device emits photons from an active region of a III-nitride semiconductor device and propagates the emitted light into free space. "QPI" is a registered trademark of Ostendo Technologies, Inc., assignee of the present invention. In addition to QPI imagers wherein each pixel emits light from a stack of different color solid state LEDs or laser emitters, imagers are also known that emit light from different color solid state LEDs or laser emitters that are disposed in a side by side arrangement with multiple solid state LEDs or laser emitters serving a single pixel. Such devices of the present invention will be referred to generally as emissive display devices. Further, the present invention can be used to create light sources for many types of Spatial Light Modulators (SLMs, micro-displays) such as DLPs and LCOS and also can be used as a Backlight Source for LCDs as well.

BRIEF DESCRIPTION OF THE DRAWINGS

In the following description, like reference are used for like elements, even in different drawings. The matters defined in the description, such as detailed construction and elements, are provided to assist in a comprehensive understanding of the exemplary embodiments. However, the present invention can be practiced without those specifically defined matters. Also, well-known functions or constructions are not described in detail since they would obscure the invention with unnecessary detail. In order to understand the invention and to see how it may be carried out in practice, a few embodiments of it will now be described, by way of non-limiting examples only, with reference to accompanying drawings, in which.

DETAILED DESCRIPTION OF THE PREFERRED EMBODIMENTS

The above-referenced QPI emissive display device is but one example of an emissive micro-scale pixel array U.S. Pat. Nos. 7,623,560, 7,767,479, 7,829,902, 8,049,231, 8,243,770, 8,098,265, 8,567,960, referred to in the exemplary embodiments described below. However, it is to be understood that the illustrated QPI emissive display device is merely an example of the types of light emitting devices that may be used in and fabricated by the present invention, some of which have been previously set forth. Thus, in the description to follow, references to a QPI emissive display device are to be understood to be for purposes of specificity in the embodiments disclosed, and not for any limitation of the present invention U.S. Pat. No. 7,623,560.

Figure 3A:
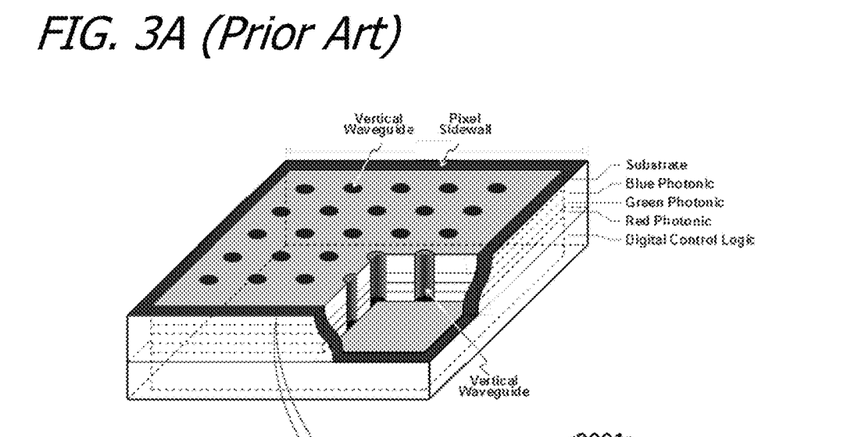
FIGS. 3A-3B illustrates views of the multicolor pixel comprising the emissive surface of a prior art Quantum Photonic Imager emissive display device showing light emission from the c-plane or the <0001> direction.
Figure 3B:
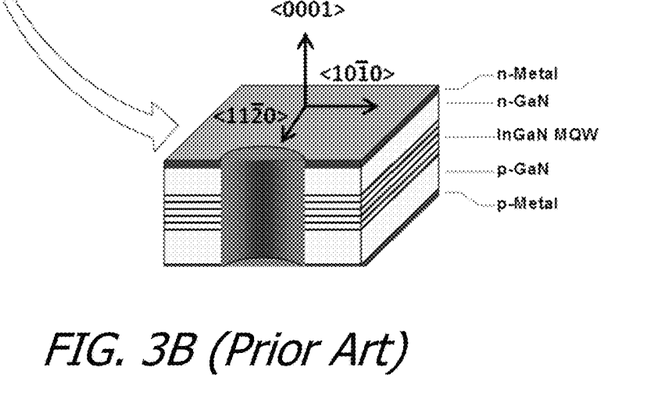
Figure 4A:
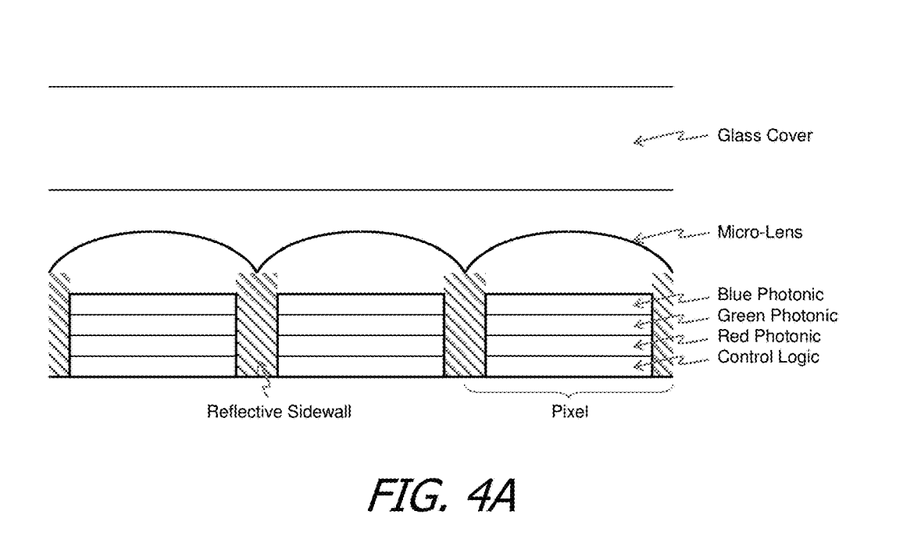
FIGS. 4A-4C illustrate views of the multicolor pixel comprising the emissive surface of the Quantum Photonic Imager emissive display device of the invention showing light emission from the nonpolar m-plane or the <10$\bar{1}$0> direction in FIG. 4C.
Figure 4B:
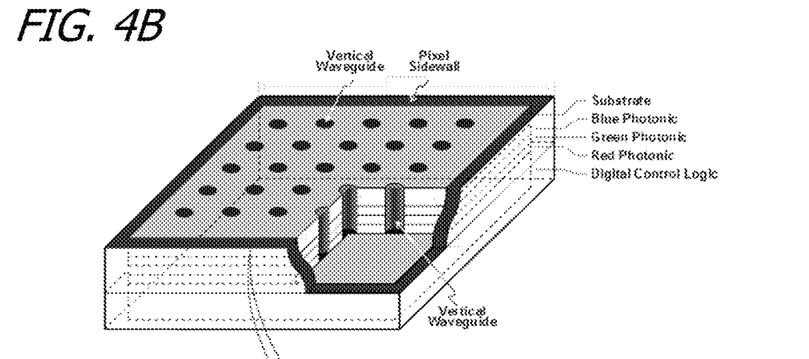
Figure 4C:
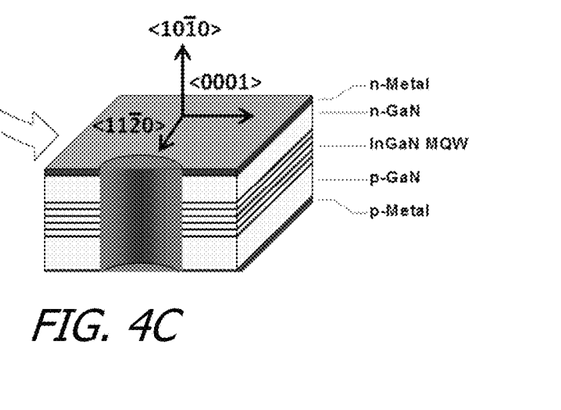

FIG. 3A and FIG. 3B show the cross-section and light emitting surface of a prior art QPI emissive display device or QPI imager as the c-plane and FIGS. 4A-4C show the side views and light emitting surface as the m-plane in a preferred embodiment of the invention. The present invention enables emissive display devices such as the QPI emissive display devices or QPI imagers and others to emit photons that either emit unpolarized or linearly polarized light.

FIGS. 4A-4C show a preferred embodiment of the invention as an example and not by way of limitation, and illustrate the QPI emissive display device pixel structure comprising a stack of multiple solid state light emitting layers comprising light emitting structures on top of a silicon-based semiconductor complementary metal oxide (Si-CMOS) structure comprising circuitry that is used to independently control the on-off state of each of the multiple solid state light emitting layers of the pixel structure. The surface dimensions of a QPI emissive display device pixel are typically in the micro-scale with a pixel pitch ranging from 1 micron to 5 microns or larger. The QPI emissive display device itself may be comprised of a one or two-dimensional array of such pixels, enabling user-desired pixel resolution in terms of the number of rows and columns forming the array of QPI emissive display device micro-pixels.

The present invention satisfies a need in the display community for light sources that can be tailored to emit various states of polarized visible light emission. Light weight, small form factor, and low power consumption are key considerations that manufacturers are cognizant of when designing display systems for the consumer market, especially for human-wearable devices. Items such as glasses, goggles, wristbands, watches, or medical device monitors to name a few, all benefit from polarized light displays that seamlessly integrate into a product and are not disruptive to the end user's application. To that end, the present invention allows the integration of a polarized light source into a QPI emissive display device without the need for extraneous hardware that undesirably grows the display system or that requires higher power input for the same number of output photons.

In preferred embodiments of the invention, a multicolor electronic emissive display device is provided comprising a two dimensional array of multicolor polarized light emitting pixel structures whereby each multicolor light emitting pixel comprises a plurality of light emitting structures fabricated from a nonpolar or semipolar III nitride material system. The light emitting structures may be configured each for emitting a different color of light and are each stacked vertically with a grid of vertical sidewalls electrically and optically separating each multicolor pixel from adjacent multicolor pixels within the array of multicolor pixels. A plurality of vertical waveguides are optically coupled to the light emitting structures to vertically emit polarized light generated by the light emitting structures from a first surface of the stack of light emitting structures. The stack of light emitting structures are stacked onto a digital semiconductor structure on a second surface opposite the first surface of the stack of light emitting structures. A plurality of digital semiconductor circuits are provided in the digital semiconductor structure, each electrically coupled to receive control signals from the periphery of the digital semiconductor structure or from the bottom of the digital semiconductor structure using plated through vias or plated interconnects on the sides of the digital semiconductor structure, for example, for connection to the outside world, so to speak. The plurality of digital semiconductor circuits in the digital semiconductor structure are electrically coupled to the multicolor light emitting structures by vertical interconnects embedded within the vertical sidewalls to separately control the on/off states of each of the multicolor light emitting structures.

The prior art QPI emissive display device is a standalone emissive display that eliminates the need for additional optical elements. Incorporated into such a device are layers of multicolor photonic elements, in this specific case, GaN or other III-V or II-VI semiconductor materials that emit unpolarized, colored light. The backbone for pixel control logic is a digital semiconductor structure that has been bonded together to form the QPI emissive display device system. It may comprise digital drive logic circuits that provide power and control signals to the stacked photonic semiconductor structure. This invention extends on the QPI device structures described in U.S. Pat. Nos. 7,623,560, 7,767,479, 7,829,902, 8,049,231, 8,243,770, 8,098,265, 8,567,960, or other micro-LED semiconductor arrays by incorporating a means of introducing intrinsic polarized light emission capabilities for various applications.

The photonic structure of the QPI emissive display device is comprised of one or more individual layers of semiconductor material. In the instance of a AlInGaN/GaN material system of the QPI emissive display device, the c-plane is grown heteroepitaxially on a sapphire substrate by a growth techniques such as MBE, MOCVD, or HVPE. Other substrate materials may be used including, but not limited to, sapphire ($Al_2O_3$), hexagonal polymorphs of SiC, GaAs, Si, spinel ($MgAl_2O_4$), amorphous silica ($SiO_2$), $LiGaO_2$, $LiAlO_2$, and ZnO. More recently, bulk GaN substrates show promising results for photonic devices but their higher price and accessibility remain an obstacle (D. Ehrentraut, R. T. Pakalapati, D. S. Kamber, W. Jiang, D. W. Pocius, B. C. Downey, M. McLaurin, and M. D'Evelyn, "High quality, low cost ammonothermal bulk GaN substrates," Japanese Journal of Applied Physics, 52, 08JA01 (2013) and W. Jie-Jun, W. Kun, Y. Tong-Jun, and Z. Guo-Yi, "GaN substrate and GaN homo-epitaxy for LEDs: Progress and challenges," Japanese Journal of Applied Physics, 24, 066105 (2015)) but can be incorporated as a substrate material nevertheless. The substrate material of choice is accompanied by a doped layer of AlN or GaN, followed by n-GaN:Si, then a fixed number of InGaN/GaN multi-quantum wells (MQWs) with various indium concentrations depending on the desired emitted wavelength of the layer, then an AlGaN electron-blocking layer, and lastly the p-GaN:Mg. This photonic structure is then patterned into a pixel array and contacts added for forming the QPI emissive display device. In order to implement the present invention, the growth direction of the QPI emissive display device photonic layer (such as GaN/InGaN) is considered as is discussed below.

The orientation of the substrate used to grow GaN, specifically the atomic positions and surface chemistry, affects the dominant crystal plane that will coalesce during the epitaxial growth process. Beginning in the mid-1970s, studies were performed that identified the stable growth planes and preferred growth directions on various substrates and orientations for the GaN material system. Most of these studies focused on sapphire since bulk $Al_2O_3$ crystals were readily available and had already been used for semiconductor epitaxy (P. A. Larssen, "Crystallographic match in epitaxy between silicon and sapphire," Acta Crystallographica, 20, 599 (1966)). For example, c-plane and a-plane sapphire substrates produce smooth c-plane GaN and AlN (H. M. Manasevit, F. M. Erdmann, and W. I. Simpson, "The use of metalorganics in the preparation of semiconductor materials: IV. The nitrides of aluminum and gallium, Journal of the Electrochemical Society, 118, 1864 (1971)). It has been firmly established that the Ga-face c-plane wurtzite GaN is a preferred growth facet for planar thin film growth in this material system. However, high quality nonpolar and semipolar films that utilize substrates such as (100) $LiAlO_2$ (P. Waltereit, O. Brandt, A. Trampert, H. T. Grahn, J. Menniger, M. Ramsteiner, M. Reiche, and K. H. Ploog, "Nitride semiconductors free of electrostatic fields for efficient white light-emitting diodes," Nature 406, 865 (2000)), r-plane $Al_2O_3$ (M. D. Craven, S. H. Lim, F. Wu, J. S. Speck, and S. P. DenBaars, Structural characterization of nonpolar ($1\bar{1}20$) a-plane GaN thin films grown on ($1\bar{1}02$) r-plane sapphire," Applied Physics Letters, 81, 469 (2002)), 6H—SiC (M. D. Craven, A. Chakraborty, B. Imer, F. Wu, S. Keller, U. K. Mishra, J. S. Speck, S. P. DenBaars, "Structural and electrical characterization of a-plane GaN grown on a-plane SiC," Physica Status Solidi (c) 0, 2132 (2003)), and more recently bulk m-plane and a-plane GaN gained traction when LED grown structures with comparable output powers to their c-plane counterparts were achieved (M. C. Schmidt, K.-C. Kim, H. Sato, N. Fellows, H. Masui, S. Nakamura, S. P. DenBaars, and J. S. Speck, "High power and high external efficiency m-plane InGaN light emitting diodes," Japanese Journal of Applied Physics, 46, L126 (2007)). Examples of such non-polar and semipolar films and applications are disclosed in, for instance, U.S. Pat. Nos. 8,728,938, 9,443,727, 8,629,065, 8,673,074, 9,023,673, 8,992,684, 9,306,116, 8,912,017, 9,416,464, 8,647,435 and U.S. Pub. Nos. 2011/0188528 and 2014/0349427, each assigned to applicant Ostendo Technologies, Inc., assignee of the instance application and the entirely of each of which is incorporated herein by reference.

The present invention enhances the light output of photonic layers, such as those found in a QPI emissive display device, by implementing growth of the semiconductor material on a substrate that favors a non-c-plane orientation of the AlInGaN material system. The present invention solves the limitation of the nature of the random polarization states of prior art emissive display devices by utilizing non-basal plane, polar or semipolar GaN. In order to utilize this method in the fabrication of a polarized emissive micro- LED display such as the QPI emissive display device, a novel pixelation process is disclosed to address the chemical structure and surface bonding molecules present due to different crystal orientations making the disclosed linearly polarized light source in a QPI emissive display device a disruptive technology over existing devices. The illustrated photonic layer(s) of the QPI emissive display device of the invention are grown in a fashion that is conducive to nonpolar or semipolar plane growth and formation as the final orientation. Substrates that can be used for growth in the nonpolar or semipolar orientation include, but are not limited to, (100) $LiAlO_2$, r-plane $Al_2O_3$, m-plane $Al_2O_3$, hexagonal polymorphs of SiC, various spinel ((100), (110), $MgAl_2O_4$) planes, (001) Si substrates with miscuts (7° for example), bulk m-plane, a-plane or a semipolar plane of GaN. Additionally, faceted sidewalls of lateral epitaxial overgrowth of c-plane GaN can be used as a substrate for non-c-plane orientation. These various substrates will produce non-c-plane orientation in the III-nitride material system and induce optical polarization anisotropy in the emitted light.

Another embodiment of the present invention is the introduction of anisotropic strain in the c-plane of GaN. This also allows optical polarization to occur due to a compressive or tensile strain on the GaN epilayers.

Each of the layers within the stack of multiple solid state light emitting layers comprising the exemplar QPI emissive display device pixels (see FIGS. 4A-4C) are designed to emit a different color wavelength, thus allowing the QPI pixel to be controlled through its Si-CMOS to emit any desired combination of multiple colors; for example, red (R), green (G) and blue (B), from the same pixel aperture to cover any desired color gamut based on the selected color coordinates of the selected RGB emission wavelengths.

The fabrication process of a preferred embodiment of the polarized light emission QPI emissive display device structure illustrated in FIGS. 4A-4C includes the steps described in the following paragraphs. The process begins with forming the QPI pixels array on the topside surface of a semiconductor light emitting photonic wafer, epitaxially grown to emit light from the nonpolar m-plane or the <10$\bar{1}$0> direction. This process, which herein is referred to as pixelation, involves the etching of the pixel sidewalls, about 1 micron in width and depth, to extend through the heterojunction diode structure of the semiconductor light emitting material, using semiconductor lithography and etch processes. The etched pixel array sidewalls are passivated with either a silicon oxide or silicon nitride thin layer using semiconductor deposition processes, then coated with a thin layer of reflective metal, such as Aluminum (Al), for example. The pixel sidewalls are then filled with metal, such as nickel, for example, using semiconductor metal deposition processes. After the pixelation pattern is processed on the topside surface of the polarized emission photonic wafer, alignment marks are added on the wafer to aide alignment of the etched pixel pattern during subsequent processing.

The same topside surface pixelation process may be performed on multiple polarized emission semiconductor light emitting photonic wafers, each having a different wavelength polarized light emission, for example, 465-nm (B), 525-nm (G) and 625-nm (R). These three topside surface processed polarized emission semiconductor light emitting photonic wafers may then be bonded one upon the other in a stack, as described in the following paragraphs, to form a polarized light emission RGB QPI emissive display device.

Figure 5A:
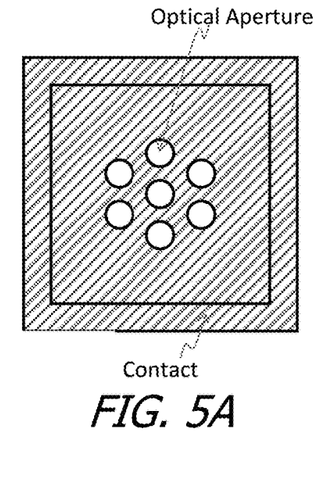
FIGS. 5A-5D illustrate various multicolor pixel contact pads for use in the polarized light emission Quantum Photonic Imager emissive display device of the invention and a cross-section of a preferred embodiment of the invention showing X, Y and common contacts.
Figure 5B:
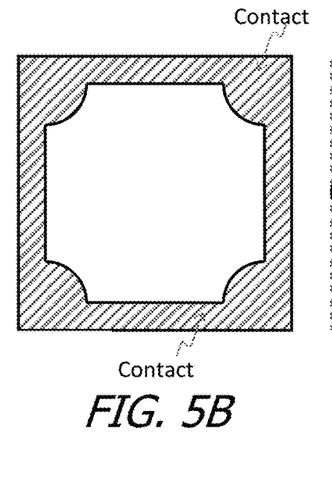
Figure 5C:
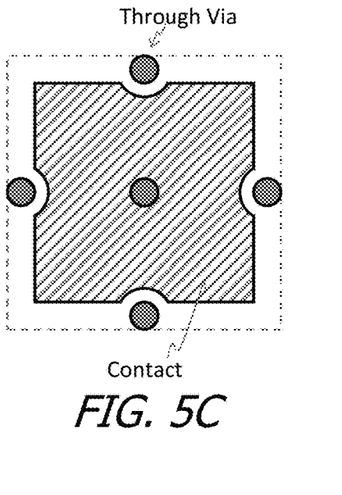

After the topside surface of the polarized emission semiconductor light emitting photonic wafers are pixelated, one of the topside contact metal patterns illustrated in FIGS. 5A-5C is deposited on each of the formed pixel arrays using semiconductor metal deposition techniques such as electron beam deposition. The contact metal pattern illustrated in FIG. 5A may be used for the Blue (B) polarized light emission photonic wafer and the contact metal pattern illustrated in FIG. 5B may be used for the topside of the Green (G) and Red (R) polarized light emission photonic wafers. The deposited contact metal is preferably a thin metal stack, for example Ti/Al, that forms an ohmic contact with the indium gallium nitride (InGaN) heterojunction diode semiconductor light emitting structure of the B, G and R polarized emission photonic wafers.

After the deposition of the contact layers, the topside of the B, G and R polarized light emission photonic wafers are processed further to form the pixel sidewalls through the semiconductor epitaxial layers which includes etching the pixels' sidewalls, passivation, then metallization and metal fill deposition. This step makes the pixel's sidewalls electrically conductive as well as optically blocking and reflective. These features of the pixel's sidewalls also prevent optical crosstalk between neighboring pixels, confine the generated light within the formed pixel reflective sidewall cavity and serve as an electrical interconnect via to conduct electrical signals to the pixels' topside contacts as well as the pixels' contacts of the topside stacked photonic layers.

In a preferred embodiment for fabricating the polarized light emission QPI emissive display device structure illustrated in FIGS. 4A-4C, a glass wafer (not shown) may be used as a substrate upon which the multi-layer pixel array structures are stacked, then bonded to the topside of a Si-CMOS wafer that is processed to include the same pixel contact pattern as the multi-layer pixel array structure stacked on the glass wafer.

In an additional preferred embodiment for fabricating the polarized light emission QPI emissive display device structure, the Si-CMOS is used as a substrate upon which the multi-layer pixel array structures are stacked, then the pixelated multi-layer wafer is bonded to a glass cover wafer. In either of the two above embodiments, the processing steps are similar and the former will be used as an example, and not by limitation, to describe the remaining steps of the polarized light emission QPI display fabrication process.

FIGS. 5A-5C illustrate three different metal contact patterns used for the polarized light emission QPI emissive display device micro-pixel's metal contact layers that are deposited on the topside of the pixelated B, G and R photonic wafer, using conventional semiconductors and lithography and metal deposition. The pixel contact pattern shown in FIG. 5A may be used on the topside of the pixelated B photonic wafers to generate collimated (for example, ±17°) to quasi-Lambertian (for example, ±45°) pixel's polarized light emission when the contact opening's diameter, height and spacing are selected to form a user-defined optical waveguide for extracting the light emitted from the polarized light emission QPI pixels. The pixel contact pattern shown in FIG. 5B is used on the topside of the pixelated B photonic wafers to generate Lambertian emission from the polarized light emission QPI pixels. The pixel contact pattern shown in FIG. 5B is also used on the pixelated G and R photonic wafers to allow maximum light transmission from the lower to upper layers of the polarized light emission QPI pixels' structures.

A yet further preferred embodiment of the polarized light emission QPI emissive display device pixel structure is illustrated in FIG. 4A wherein a glass cover wafer is first processed to pattern an array of pixel-size micro-optical elements or micro lenses that match the polarized light emission QPI pixel array pattern. When the glass cover wafer with the pixel-sized micro-optical micro lens elements is used as the substrate upon which the polarized light emission QPI multi-layer stack is formed, the resultant pixel array possesses the added capability, in addition to modulating the pixels array color and brightness, of modulating the direction of the pixel's light emission; a capability that enables modulation of light field for direct view as well as wearable near-eye displays.

After the B polarized light emission photonic wafer topside is pixelated and its topside contact layer is deposited, the wafer is then bonded to the glass cover wafer, with or without the pixel-size micro-optical micro lens elements incorporated, using semiconductor bonding techniques such as fusion bonding, for example. The epitaxial growth sapphire wafer is then lifted off, using known semiconductor laser lift off (LLO) techniques and the structure is thinned down to remove the epitaxial growth GaN buffer leaving a thin layer (<2 micron) comprising the B semiconductor polarized light emitting heterojunction diode structure enclosed within the formed pixels' sidewalls. With the backside of the pixelated B polarized light emission photonic wafer exposed, the pixel array backside contact pattern illustrated in FIG. 5B, is deposited as thin metal stacks, for example Ti/Al, using semiconductor metal deposition techniques.

Herein the term "in-process QPI wafer" is used to refer to the processed multi-layer stacked wafer which incorporate the multiple layers stacked up to that point the process. In using such terminology, the topside of the in-process QPI wafer thus, as illustrated, becomes the backside of the last layer bonded.

The topside of the in-process QPI wafer, which is the pixelated B photonic layer backside, is then processed to deposit the bonding intermediary layer incorporating electrical contact vias aligned with the pixels' array sidewalls. The bonding intermediary layer is a thin layer of either silicon oxide or silicon nitride deposited using conventional semiconductor deposition techniques such as plasma-assisted chemical vapor deposition (PECVD), for example. After the bonding intermediary layer is deposited, the in-process QPI wafer surface is planarized to a surface planarization level sufficient for bonding with the topside of other wafers to form the multi-layer stack of the polarized light emission QPI emissive display device.

The topside of the in-process QPI wafer, which would be the B layer backside with the bonding intermediary layer added, is then processed to bond it to the G photonic wafer topside. This is accomplished using aligned bonding of the pixelated G photonic wafer to the topside of the QPI in-process wafer using semiconductor bonding process such as fusion bonding, for example.

With the pixelated G photonic wafer bonded to the in-process QPI wafer, the epitaxial growth sapphire wafer of the G polarized light emission photonic wafer is lifted off, typically using semiconductor laser lift off (LLO) techniques, and the structure is thinned down to remove the epitaxial growth GaN buffer leaving only a thin layer (<2 micron) comprising the G semiconductor polarized light emitting heterojunction diode structure enclosed within the formed pixel sidewalls. With the backside of the pixelated G photonic wafer exposed, the pixel array backside contact pattern of FIG. 5B, is deposited of a thin metal stack, for example Ti/Al, using semiconductors metal deposition techniques.

The topside of the in-process NCP-QPI wafer, which is the pixelated G photonic layer backside, is then processed to deposit the bonding intermediary layer incorporating electrical contact vias aligned with the pixels' array sidewalls. The bonding intermediary layer is a thin layer of either silicon oxide or silicon nitride deposited using conventional semiconductor deposition techniques such as plasma assisted chemical vapor deposition (PECVD), for example. After the bonding intermediary layer is deposited, the in-process QPI wafer surface is planarized to a surface planarization level sufficient for bonding with topside of other wafers to form the multi-layer stack of the polarized light emission QPI device.

The topside of the in-process QPI wafer, which would be the G layer backside with the bonding intermediary layer added, is then processed to bond it to the R photonic wafer topside. This is accomplished using aligned bonding of the pixelated R photonic wafer to the topside of the QPI in-process wafer using semiconductor bonding processes such as fusion bonding, for example.

With the pixelated R photonic wafer bonded to the in-process QPI wafer, the epitaxial growth sapphire wafer of the R polarized light emission photonic wafer is then lifted off, typically using semiconductor laser lift off (LLO) techniques, and the structure is thinned down to remove the epitaxial growth GaN buffer leaving only a thin layer (<2 micron) comprising the R semiconductor polarized light emitting heterojunction diode structure enclosed within the formed pixel sidewalls. With the backside of the pixelated R photonic wafer exposed, the pixel array backside contact pattern of FIG. 5C, is deposited of a thin metal stack, for example Ti/Al, using semiconductor metal deposition techniques.

As illustrated in FIG. 5C, the topside of the QPI in-process wafer has three contact vias per pixel; the center contact via, which is the unique contact of the R photonic layer of the pixel, the x-sidewall contact via which is the unique contact of the B photonic layer of the pixel and the y-sidewall contact via, which is the unique contact of the G photonic layer of the pixel. The common contacts for the entire pixel array; namely, the three intermediate contact layers added on the topside of the B, G and R photonic layers are formed as common contact rails that extend to the peripheral edges of the polarized light emission QPI die where they are connected to a set of common contact vias forming a ring at the peripheral boundaries of each of the polarized light emission QPI die comprising the in-process QPI wafer.

The in-process QPI wafer topside is then comprised of an array of micro-scale contact vias whereby the pixel-center via is the unique contact of the R photonic layer of the pixel array, the x-sidewall contact via is the unique contact of the B excitation photonic layer of the pixel array, the y-sidewall contact via is the unique contact of the G emission photonic layer of the pixel array and the micro-via ring at the peripheral boundaries of each of the QPI dies comprises the in-process QPI wafer providing the common contacts of all three photonic layers of the pixel array comprising the QPI multi emissive layer stack.

Figure 5D:
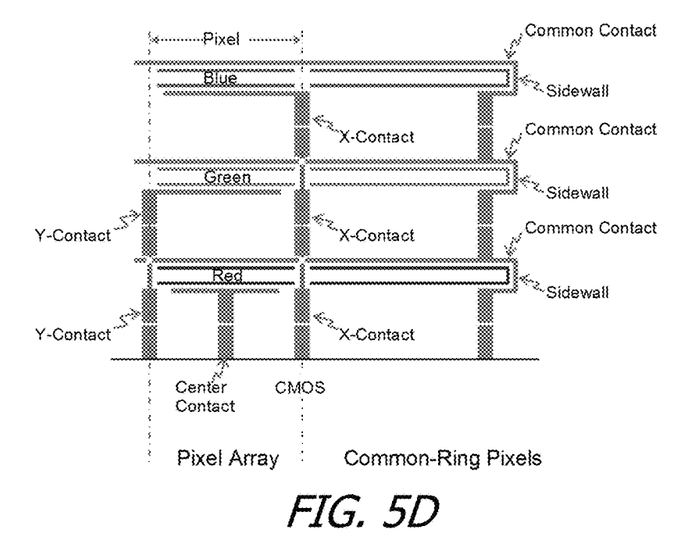

As illustrated in FIG. 5D, the topside of each the QPI emissive display device dies comprising the Si-CMOS wafer includes a micro-via array with a pattern matching the pattern of micro-via array of the in-process QPI wafer described in the previous paragraph. When the Si-CMOS wafer is aligned and bonded to the in-process QPI emissive display device wafer using semiconductor bonding techniques, such as fusion bonding, for example, the bonding interface micro-via array provides electrical contact between the unique contacts of the pixel arrays of the multiple photonic layers of the polarized multi-color polarized light emission QPI emissive display device as well as the common contact ring at the peripheral boundaries of each of the die comprising the QPI emissive display device wafer.

It was previously mentioned that the introduction of anisotropic strain in the c-plane of GaN allows optical polarization to occur due to a compressive or tensile strain on the GaN epilayers. In particular, if at least one of the layers is fabricated from a c-plane orientation GaN material system of epilayers wherein an anisotropic strain is induced in the c-plane GaN, an optical polarization in an emitted light from the light emitting structures occurs due to a compressive or tensile strain on at least one of the GaN epilayers (strain components $\varepsilon_{xx} \neq \varepsilon_{yy}$). One way of achieving this affect is to deliberately introduce strain into the GaN layers. Growth of GaN on A-plane sapphire causes such strain as well as Al-rich AlN/$Al_xGa_{1-x}$N quantum wells or $Al_xGa_{1-x}$N strain compensation layers. In this case Al-rich quantum wells, the strain compensation layers would be integral layers of the polarized light emissive structure. Nanostructures grown on c-plane is another way to realize polarized emission. Examples include photonic crystals, metallic nanoparticles, elliptic nanorods and nano-gratings. Again, in the case of the elliptic nanorods and nano-gratings, the in-plane strain asymmetry is attributed for the creation of the polarized light.

Figure 6:
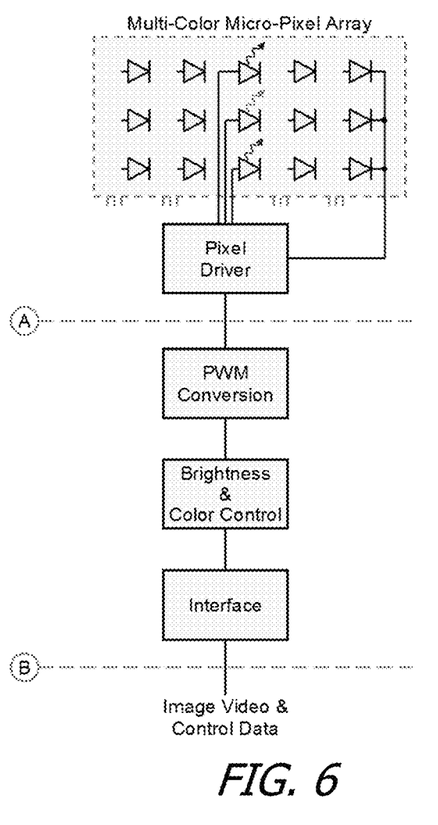
FIG. 6 illustrates a functional block diagram of the polarized light emission Quantum Photonic Imager emissive display device of the invention.

FIG. 6 illustrates a functional block diagram of the multi-color polarized light emission QPI emissive display device. FIG. 6 shows the multi-color micro-pixel array of the QPI emissive display device being driven by the control logic of its Si-COMS. FIG. 6 also shows two possible embodiments for the QPI Si-CMOS control logic with two possible interfaces. In the first embodiment (above (A)), the function of the QPI Si-CMOS control logic includes only the multi-color, micro-pixel array drivers and the QPI emissive display device in this case will receive control signals and pixel array bit-fields containing the pulse width modulation (PWM) bits for every color of each pixel from an external source. In the second embodiment (above (B)), the function of the QPI Si-CMOS control logic may additionally include the logic function required to generate PWM bit-fields for the multi-color micro-pixel array.

In the second embodiment, the QPI Si-CMOS control logic receives a serial bit-stream containing the light modulation video input and related control data through its interface block. In this embodiment of the polarized multi-color emission QPI emissive display device, the Si-CMOS control logic received light modulation video bit-stream is processed by the Color & Brightness Control block for de-gamma linearization, gamut transformation, white point adjustment and color and brightness uniformity correction across the micro-pixel array. The bit stream output of the Color & Brightness Control block is then converted to PWM bit-fields, then clocked into the pixel driver array incorporated together within the QPI Si-CMOS. In effect, the latter embodiment of the QPI Si-CMOS control logic of the polarized light emission QPI emissive display device does not require external video stream processing support and operates with a standard high speed interface such as Low Voltage Differential Signaling (LVDS) interface or the like. The latter embodiment of the QPI Si-CMOS enables lower power consumption and smaller volumetric aspects for the polarized light emission QPI applications. In either embodiment, the connections to the outside world may be, for example, as already described herein.

One of the primary advantages of the described polarized light emission QPI emissive display device is its low power consumption which is achieved by multiple factors: (1) the high internal quantum efficiency (IQE) of its photonic layers; (2) the high quantum yield (QY) conversion efficiency of the directly polarized multi-color light emission from its emissive multi-layers; (3) the increased optical aperture conversion efficiency of its V-B excitation light by the light confinement actions of the NPC-QPI pixel optical cavity; (4) the increased conversion efficiency of its V-B excitation light by the light confinement actions of the optical sub-cavities formed by the pixel's BPF layers, and reflective sidewalls and contacts; and; (5) the spectral shaping actions of the pixel's BPF layers to match the HVS photopic response.

The low power consumption of the described polarized light emission QPI emissive display device makes it very effective in display applications requiring small volumetric aspects and higher brightness at low power consumption such as near-eye displays for virtual and augmented reality (AR/VR) applications. The wavelengths selected (only primary colors set forth) in preceding description of the multiple embodiments of this disclosure are for example purpose and other selections of these wavelengths following the same methods of this invention are within the scope of this invention. Also, the emissive micro-scale pixels combined with the low power consumption of the described polarized light emission QPI emissive display device make it very effective in light field display applications which typically require micro-scale pixel pitches, small volumetric aspects and higher brightness at low power consumption plus require a directionally modulated micro-pixel. Of course, the combination of these two display applications; namely, light field near-eye AR/VR display, stands to benefit substantially by the small volume, high brightness, light field modulation and low power consumption capabilities of the polarized light emission QPI emissive display device of this invention.

It is noted that the emission wavelength values used in the preceding description of the polarized QPI emissive display device structure of this invention are exemplary illustrations of the methods of this invention. A person skilled in the art of light emitting structures would recognize how to use the disclosed methods of this invention to create a emissive micro-pixel spatial light modulator having polarized light emission using a different set of light wavelengths to generate different sets of emission wavelengths. A person skilled in the art would recognize how use disclosed methods of the polarized light emission QPI emissive display device structure pixels' optical confinement created by the pixels' reflective sidewalls, reflective contacts and electrical interconnect sidewalls with different design parameters to create high efficiency multi-color micro-pixel array device that emits polarized light.

It is further noted that the nonpolar and semipolar crystalline orientation of the polarized light emission QPI emissive display device enables higher intake ratios of indium in the epitaxial growth of the InGaN/GaN heterojunction diode structure of the semiconductor light emitting material. Such higher indium intake ratios enable the emission of polarized long wavelength light in the Amber (615-nm) to Red (625-nm) range with excellent IQE and saturation characteristics and the fabrication of efficient polarized light emission QPI emissive display devices having multi color emission covering the full span of the visible light spectrum. This is an important advantage of the polarized light emission QPI emissive display device described in this disclosure because it is a known challenge to achieve similar results using polar crystalline orientation because of indium's segregation at high intake ratios.

It is yet further noted that the methods for the fabrication of emissive multi-color polarized light emission QPI display structures described in this disclosure can be combined with the methods for the fabrication of non-polarized light emission QPI emissive display devices described in U.S. Pat. Nos. 7,623,560, 7,767,479, 7,829,902, 8,049,231, 8,243,770, 8,098,265, 8,567,960 to enable the fabrication of multi-color emission QPI emissive display devices with polarized and non-polarized light emission at different emission wavelengths across the visible light spectrum. Such light modulation capability enables a new class of displays that benefit from the emission of both polarized and non-polarized light emission from an emissive micro-pixel array at different emission wavelengths across the visible light spectrum.

It is also important to note that the methods for the fabrication of the polarized light emission QPI emissive display device described in this disclosure can be readily used to create a polarized light emission QPI emissive display device having a single wavelength emission by executing the described fabrication process using only one photonic wafer having the desired emission wavelength.

Those skilled in the art will readily appreciate that various modifications and changes can be applied to the embodiments of the invention without departing from its scope defined in and by the appended claims. It should be appreciated that the foregoing examples of the invention are illustrative only, and that the invention can be embodied in other specific forms without departing from the spirit or essential characteristics thereof. The disclosed embodiments, therefore, should not be considered to be restrictive in any sense. The scope of the invention is indicated by the appended claims, rather than the preceding description, and all variations which fall within the meaning and range of equivalents thereof are intended to be embraced therein.

What is claimed is:

1. A multicolor electronic emissive display device comprising a two dimensional array of multicolor polarized light emitting pixels whereby each multicolor light emitting pixel comprises:
   a plurality of light emitting layers fabricated from a nonpolar or semipolar III nitride material system, each having in-plane strain asymmetry due to compressive or tensile strain on at least one epilayer for creation of polarized light and each for emitting a different color, stacked vertically with a grid of vertical sidewalls electrically and optically separating each multicolor pixel from adjacent multicolor pixels within the array of multicolor pixels;
   a plurality of vertical waveguides forming a trench etched in, and optically coupled to, the light emitting layers to vertically emit the polarized light generated by the light emitting layers from a first surface of the stack of light emitting layers;
   the stack of light emitting layers being stacked onto a digital semiconductor structure by a second surface opposite the first surface of the stack of light emitting layers; and;
   a plurality of digital semiconductor circuits in the digital semiconductor structure, each electrically coupled to the multicolor light emitting layers by vertical interconnects embedded within the vertical sidewalls to separately control the on/off states of each of the multicolor light emitting layers.

2. The multicolor electronic emissive display device of claim 1 wherein the digital semiconductor structure is electrically coupled to receive control signals and pixel array bit-fields containing the pulse width modulation (PWM) bits for every color of each pixel from an external source to separately control the on/off states of each or the multicolor light emitting layers.

3. The multicolor electronic emissive display device of claim 1 wherein the digital semiconductor structure is electrically coupled to receive a light modulation video bitstream and further comprises logic functions required to generate PWM bit-fields for the multi-color micro-pixel array to separately control the on/off states of each of the multicolor light emitting layers.

* * * * *